United States Patent
Kimura et al.

(10) Patent No.: US 9,658,293 B2
(45) Date of Patent: May 23, 2017

(54) POWER SUPPLY UNIT, VEHICLE AND STORAGE BATTERY UNIT EQUIPPED WITH POWER SUPPLY UNIT, AND REMAINING CAPACITY DETECTING METHOD OF BATTERY

(71) Applicant: Sanyo Electric Co., Ltd., Osaka (JP)

(72) Inventors: Yuri Kimura, Hyogo (JP); Kentaro Uemura, Hyogo (JP); Daiki Hamada, Hyogo (JP); Hiroya Murao, Hyogo (JP)

(73) Assignee: SANYO ELECTRIC CO., LTD., Osaka (JP)

( * ) Notice: Subject to any disclaimer, the term of this patent is extended or adjusted under 35 U.S.C. 154(b) by 415 days.

(21) Appl. No.: 14/372,229

(22) PCT Filed: Feb. 23, 2013

(86) PCT No.: PCT/JP2013/054631
§ 371 (c)(1),
(2) Date: Jul. 15, 2014

(87) PCT Pub. No.: WO2013/129273
PCT Pub. Date: Sep. 6, 2013

(65) Prior Publication Data
US 2014/0343877 A1 Nov. 20, 2014

(30) Foreign Application Priority Data
Feb. 29, 2012 (JP) .................................. 2012-044525

(51) Int. Cl.
*G01R 31/36* (2006.01)
*H02J 7/00* (2006.01)

(52) U.S. Cl.
CPC ..... *G01R 31/3648* (2013.01); *G01R 31/3606* (2013.01); *H02J 7/0068* (2013.01); *G01R 31/3613* (2013.01); *G01R 31/3624* (2013.01)

(58) Field of Classification Search
CPC .................................................. G01R 31/3648
(Continued)

(56) References Cited

U.S. PATENT DOCUMENTS

| 5,847,566 A * | 12/1998 | Marritt | G01R 31/362 324/427 |
| 2005/0154544 A1* | 7/2005 | Ono | G01R 31/361 702/63 |
| 2006/0076929 A1 | 4/2006 | Tatsumi et al. | |
| 2008/0030169 A1* | 2/2008 | Kamishima | G01R 31/361 320/134 |

(Continued)

FOREIGN PATENT DOCUMENTS

| JP | 2000-150003 | 5/2000 |
| JP | 2001-091604 | 4/2001 |

(Continued)

OTHER PUBLICATIONS

International Search Report issued Jun. 4, 2013 in International (PCT) Application No. PCT/JP2013/054631.

*Primary Examiner* — Ricky Ngon
(74) *Attorney, Agent, or Firm* — Wenderoth, Lind & Ponack, L.L.P.

(57) ABSTRACT

A power supply unit comprises a battery, current and voltage detecting portions, and a remaining capacity computing portion. The remaining capacity computing portion comprises a first computing portion computing a first open circuit terminal voltage based on current and voltage values from the current and voltage detecting portions, and computing a first remaining capacity based on the first open circuit terminal voltage, a second computing portion computing a second open circuit terminal voltage based on the current and voltage values, an ohmic resistance voltage drop and a polarization resistance voltage drop, and computing a second remaining capacity based on the second open circuit (Continued)

terminal voltage, a third computing portion calculating a third remaining capacity based on an integrated value by integrating the current, and a main computing portion computing a real remaining capacity of the battery based on the first and/or third remaining capacity, and the second remaining capacity.

4 Claims, 6 Drawing Sheets

(58) Field of Classification Search
USPC .......................................................... 702/63
See application file for complete search history.

(56) References Cited

U.S. PATENT DOCUMENTS

| 2010/0250162 A1* | 9/2010 | White | G01R 31/3679 |
| | | | 702/63 |
| 2010/0289454 A1* | 11/2010 | Akabori | G01R 31/3606 |
| | | | 320/132 |
| 2010/0324846 A1* | 12/2010 | Marsh | G01R 31/3679 |
| | | | 702/63 |
| 2011/0004428 A1* | 1/2011 | Murochi | G01R 31/3679 |
| | | | 702/63 |
| 2011/0109273 A1 | 5/2011 | Tamezane | |

FOREIGN PATENT DOCUMENTS

| JP | 2006-112786 | 4/2006 |
| JP | 2011-103748 | 5/2011 |

\* cited by examiner

POWER SUPPLY UNIT, VEHICLE AND STORAGE BATTERY UNIT EQUIPPED WITH POWER SUPPLY UNIT, AND REMAINING CAPACITY DETECTING METHOD OF BATTERY

TECHNICAL FIELD

The present invention relates to a power supply unit and a method of detecting a remaining capacity of a charging and discharging battery, especially is used for a power source equipped with a plurality of the battery, the power supply unit suitable for detecting the remaining capacity of the battery, a vehicle and a storage battery unit equipped with this power supply unit, and a remaining capacity detecting method of the battery.

BACKGROUND ART

A power supply unit is installed in a vehicle and provides an electric power to a motor to drive the vehicle. The power supply unit accelerates the vehicle by the motor using a discharge of the battery. The power supply unit is charged through regenerative braking of decelerating the vehicle or driving of the generator by an engine. In the power supply unit as a type of a stationary storage battery, the battery is charged through a charging power source, for example, a midnight power from a commercial power supply, a solar cell, or the like. In the battery used in such a manner, It is important to reduce a degradation of the battery or use the battery safely. When the battery is over-discharged or over-charged, the degradation proceeds, and it decreased a cycle life. This disadvantage is resolved by precisely detecting the remaining capacity (state-of-charge [SOC]) of the battery which varies by charging and discharging, and limiting an available power in charging and discharging of the battery. The remaining capacity of the battery is computed through an integrated value by integrating a current value in charging and discharging of the battery. In this method, the remaining capacity [SOCi (%)] is computed through subtracting the integrated value of a discharging current, adding the integrated value of a charging current The integrated SOCi is shown, for example, 100% in the full charge, as the ratio (%) of a remaining capacity (Ah) to the full charge capacity (Ah). The current integrated remaining capacity SOCi doesn't necessarily always show the accurate remaining capacity of the battery. An error in the current integrated remaining capacity happens, and it is caused by a current measurement error, the battery temperature and the like In order to resolve this disadvantage, the computed method of the real remaining capacity [SOC (%)] based on both the current integrated remaining capacity [SOCi (%)] and the remaining capacity [SOCv (%)] detected through the voltage is developed in the charging or discharging stage (see Patent Literature 1).

In the remaining detection method, the remaining capacity SOCi is computed through an integrated value by integrating a current value in charging and discharging of the battery, in addition, the remaining capacity [SOCv (%)] detected through the open circuit terminal voltage of the battery, so the real remaining capacity [SOC (%)] is computed based on both the current integrated remaining capacity [SOCi (%)] and the remaining capacity [SOCv (%)]. The remaining capacity [SOCv (%)] is computed in the following equation.
(1) By detecting the current and the voltage of battery, the open circuit voltage Voc is computed. In order to detect the open circuit voltage Voc through the current and the voltage of battery, detecting the characteristics between the current and the voltage, and an internal resistance R is computed through the inclination in the characteristics between the current and the voltage, so the open circuit terminal voltage Voc is calculated in the following equation.

Open circuit terminal voltage Voc=Detected voltage ($V$)+Discharging current ($I$)×Internal resistance ($R$).

(2) From the calculated open circuit terminal voltage, the remaining capacity SOCv through the memorized characteristics between the open circuit terminal voltage and the remaining capacity is computed. In order to detect the remaining capacity through the open circuit terminal voltage, the remaining capacity corresponding to the open circuit terminal voltage Voc is stored in a memory as the characteristics between the open circuit terminal voltage and the remaining capacity.

CITATION LIST

Patent Literature

Patent Literature 1:
Japanese Laid-Open Patent Publication No. 2006-112786

SUMMARY OF THE INVENTION

The real remaining capacity SOC in the above method is more accurately detected than detecting only the current integrated remaining capacity SOCi. However, in the above method, it is difficult to accurately detect the internal resistance R, and it is also difficult to accurately detect the open circuit terminal voltage Voc through the internal resistance R.

The present disclosure is developed for the purpose of solving such drawbacks. One embodiment provides the power supply unit, a vehicle and a storage battery unit equipped with this power supply unit, and a remaining capacity detecting method of the battery which are able to accurately detect the remaining capacity of the battery.

A power supply unit of the present disclosure comprises a charging and discharging battery, a current detecting portion detecting charging and discharging current of the battery, a voltage detecting portion detecting voltage of the battery, and a remaining capacity computing portion calculating a remaining capacity based on the current detected by the current detecting portion and the voltage detected by the voltage detecting portion. The voltage detecting portion detects and outputs the voltage of the charging and discharging battery to the remaining capacity computing portion. The current detecting portion 16 detects and outputs the current of the charging and discharging battery to the remaining capacity computing portion. The remaining capacity computing portion comprises a first computing portion computing a first open circuit terminal voltage Voc1 based on a plurality of values of the current and the voltage inputted from the current detecting portion and the voltage detecting portion, and computing a first remaining capacity based on the first open circuit terminal voltage Voc1, a second computing portion computing a second open circuit terminal voltage Voc2 based on values of the current and the voltage inputted from the current detecting portion 16 and the voltage detecting portion, a voltage drop Vo by an ohmic resistance Ro and a voltage drop Vp by a polarization resistance Rp, and computing a second remaining capacity based on the second open circuit terminal voltage Voc2, a third computing portion calculating a third remaining capacity based on an integrated value by integrating the current value inputted from the current detecting portion, a main computing portion computing a real remaining capacity of the charging and discharging battery based on the first remaining capacity computed by the first computing portion or/and the third remaining capacity calculated by the third computing portion, and the second remaining capacity computed by the second computing portion.

The above power supply unit can accurately detect the real remaining capacity. The above power supply unit can computes the third remaining capacity SOCi based on an integrated value by integrating the current value. And the above power supply unit can computes the first remaining capacity SOCv1 based on the first open circuit terminal voltage Voc1 through a plurality of values of the current and the voltage, the second remaining capacity SOCv2 based on the second open circuit terminal voltage Voc2 considering the values of the current and the voltage, the ohmic resistance Ro, and the polarization resistance Rp, as a remaining capacity SOCv based on an open circuit terminal voltage Voc. So the above power supply unit can compute the real remaining capacity based on the first remaining capacity SOCv1 or/and the third remaining capacity SOCi, and the second remaining capacity SOCv2.

In the power supply unit of the present disclosure, the main computing portion can compute the real remaining capacity [SOC (%)] of the charging and discharging battery by weighted-averaging the first remaining capacity [SOCv1 (%)] or/and the third remaining capacity [SOCi (%)], and the second remaining capacity [SOCv2(%)] in the following equation 1.

$$\text{The real remaining capacity [SOC (\%)]} = A \times \text{SOC}i\,(\%) + B \times \text{SOC}v1(\%) + C \times \text{SOC}v2(\%) \quad \text{[Equation 1]}$$

In the above equation 1, A, B, and C are constants, A is equal to or more than 0, and B is equal to or more than 0, and C is more than 0, and A+B+C=1. "×" means multiplication in this disclosure.

By weighted-averaging the first remaining capacity SOCv1(%) or/and the third remaining capacity SOCi (%), and the second remaining capacity SOCv2(%), and appropriately determining the constants of A, B, and C through the current and the voltage of the battery, the above power supply unit can accurately detect the real remaining capacity.

In the power supply unit of the present disclosure, the remaining capacity computing portion comprises a memory to store values of A, B, and C, and the values of A stored in the memory are low in the range of high and low level in the real remaining capacity of the battery. Therefore, the third remaining capacity SOCi is lightly weighted-averaged.

In the range of the high level in the real remaining capacity of the battery, namely in the state around the maximum voltage of the battery, or in the range of the low level in the real remaining capacity of the battery, namely in the state around the minimum voltage of the battery, the third remaining capacity SOCi is lightly weighted-averaged. Namely, in this range, the first remaining capacity SOCv1 and the second remaining capacity SOCv2 are heavily weighted-averaged. In the state around the maximum voltage or the minimum voltage, the remaining capacity corresponding to the voltage is accurately specified.

In the power supply unit of the present disclosure, the remaining capacity computing portion comprises a memory to store values of A, B, and C, and the values of B stored in the memory 45 are high in the range of a large variation width in the current of the battery. Therefore, the first remaining capacity SOCv1 is heavily weighted-averaged.

In the range of a large variation width in the current of the battery, the remaining capacity is accurately detected. In the state of the large variation width in the current of the battery where the current varies or changes largely, the first remaining capacity SOCv1 which is heavily weighted-averaged is accurately computed.

Furthermore, in the power supply unit of the present disclosure, the second computing portion computes the second open circuit terminal voltage Voc2 by computing both the voltage drop Vo by the ohmic resistance Ro and the voltage drop Vp by the polarization resistance Rp in the following equation 2, based on the values of the current and the voltage of the charging and discharging battery.

$$\text{the second open circuit terminal voltage Voc2} = V\_n - Vp - Vo - Vh \quad \text{[Equation 2]}$$

$$Vp = Rp\,[\text{ohm}] \times I\_n\,[\text{A}] \times \text{tau} \times a$$

$$Vo = Ro\,[\text{ohm}] \times I\_n\,[\text{A}] \times b \times c$$

In the above equation 2,
V_n is the voltage of the battery at a certain time,
I_n is the current of the battery at the same time as the voltage is detected, a minus value (−) means a discharging current, a plus value (+) means a charging current,
tau, a, b, c, are constants specified by a temperature,
Vh is a variable specified by hysteresis characteristics of charging and discharging of the battery.

Optimally compensating the ohmic resistance Ro and the polarization resistance Rp by the constants which vary depending on a degradation degree or temperature, and the hysteresis characteristics, the above power supply unit can accurately detect or compute the real remaining capacity.

Furthermore, in the power supply unit of the present disclosure, the first computing portion detects the current and the voltage of the charging and discharging battery, and computes the first open circuit terminal voltage Voc1 based on only the detected values of the current and the voltage.

The above power supply unit can easily compute the first open circuit terminal voltage Voc1 through the detected values of the current and the voltage, and detect the first remaining capacity SOCv1.

Furthermore, in the power supply unit of the present disclosure, the ohmic resistance Ro and the polarization resistance Rp are specified based on a degradation degree of the battery.

Specifying the ohmic resistance Ro and the polarization resistance Rp based on a degradation degree of the battery, and considering a parameter which varies depending on the degradation degree, the above power supply unit can accurately detect the second remaining capacity SOCv2. This can get the more real value by calculating through using the parameter which is influenced by the degradation degree.

Furthermore, in a vehicle which comprises the power supply unit of the present disclosure, having any one of the above power supply unit, a motor driven by an electric power supplied from the power supply unit or a generator 34 charging the power supply unit is installed.

Furthermore, in a storage battery unit which comprises the power supply unit of the present disclosure, having any one of the above power supply unit, the storage battery unit supplies an electric power to a load, or is charged by an electric power from a charging power source which is externally connected.

In the present disclosure, a remaining capacity detecting method of a real remaining capacity of a battery is based on a remaining capacity by detecting an open circuit terminal voltage Voc of the battery, and a remaining capacity by computing an integrated value by integrating a current value.

The remaining capacity detecting method comprises computing a first open circuit terminal voltage Voc1 by detecting a current and a voltage of the charging and discharging battery multiple times, computing a first remaining capacity based on the first open circuit terminal voltage Voc1, computing a second open circuit terminal voltage Voc2 by detecting a current and a voltage of the charging and discharging battery, a voltage drop Vo by an ohmic resistance Ro and a voltage drop Vp by a polarization resistance Rp, computing a second remaining capacity based on the second open circuit terminal voltage Voc2, calculating a third remaining capacity based on an integrated value by integrating a current value, and computing a real remaining capacity of the charging and discharging battery based on the first remaining capacity, the second remaining capacity, and the third remaining capacity.

The above detecting method can accurately detect the real remaining capacity. The above detecting method can compute the third remaining capacity SOCi based on an integrated value by integrating the current value. And the above detecting method can compute the first remaining capacity SOCv1 based on the first open circuit terminal voltage Voc1 through a plurality of values of the current and the voltage, the second remaining capacity SOCv2 based on the second open circuit terminal voltage Voc2 considering the values of the current and the voltage, the ohmic resistance Ro, and the polarization resistance Rp, as a remaining capacity SOCv based on an open circuit terminal voltage Voc. So the above detecting method can compute the real remaining capacity based on the first remaining capacity SOCv1, the second remaining capacity SOCv2, and the third remaining capacity SOCi through the integrated current value.

DESCRIPTION OF EMBODIMENTS

Hereinafter, the embodiment of the present invention will be described referring to drawings. However, the following embodiments illustrate a power supply unit, a vehicle and a storage battery unit equipped with the power supply unit, and a remaining capacity detecting method of the battery which are aimed at embodying the technological concept of the present invention, and the present invention is not limited to the power supply unit, the vehicle and the storage battery unit equipped with the power supply unit, and the remaining capacity detecting method of the battery described below. It is noted that the magnitude or positional relation of the members illustrated in each diagram is sometimes grandiloquently represented, in order to clarify the description. Furthermore, in the description below, identical names and reference numbers represent identical or homogeneous members, and detailed descriptions are appropriately omitted. Moreover, mode may be applied where each element constituting the present invention constitutes a plurality of elements with the use of the same member, thereby serving the plurality of elements with the use of one member, or, in contrast, mode may be realized where a function of the one member is shared by a plurality of members.

As the one embodiment of the present invention, the power supply unit of a power source which is installed in the vehicle and supplies a power to a load in the vehicle is described below in detail. The power supply unit of the one embodiment of the present invention is not limited to the power supply unit installed in the vehicle, and the power supply unit as a storage battery unit can be used being placed in a stationary state.

(Power Supply Unit 100)

Figure 1:
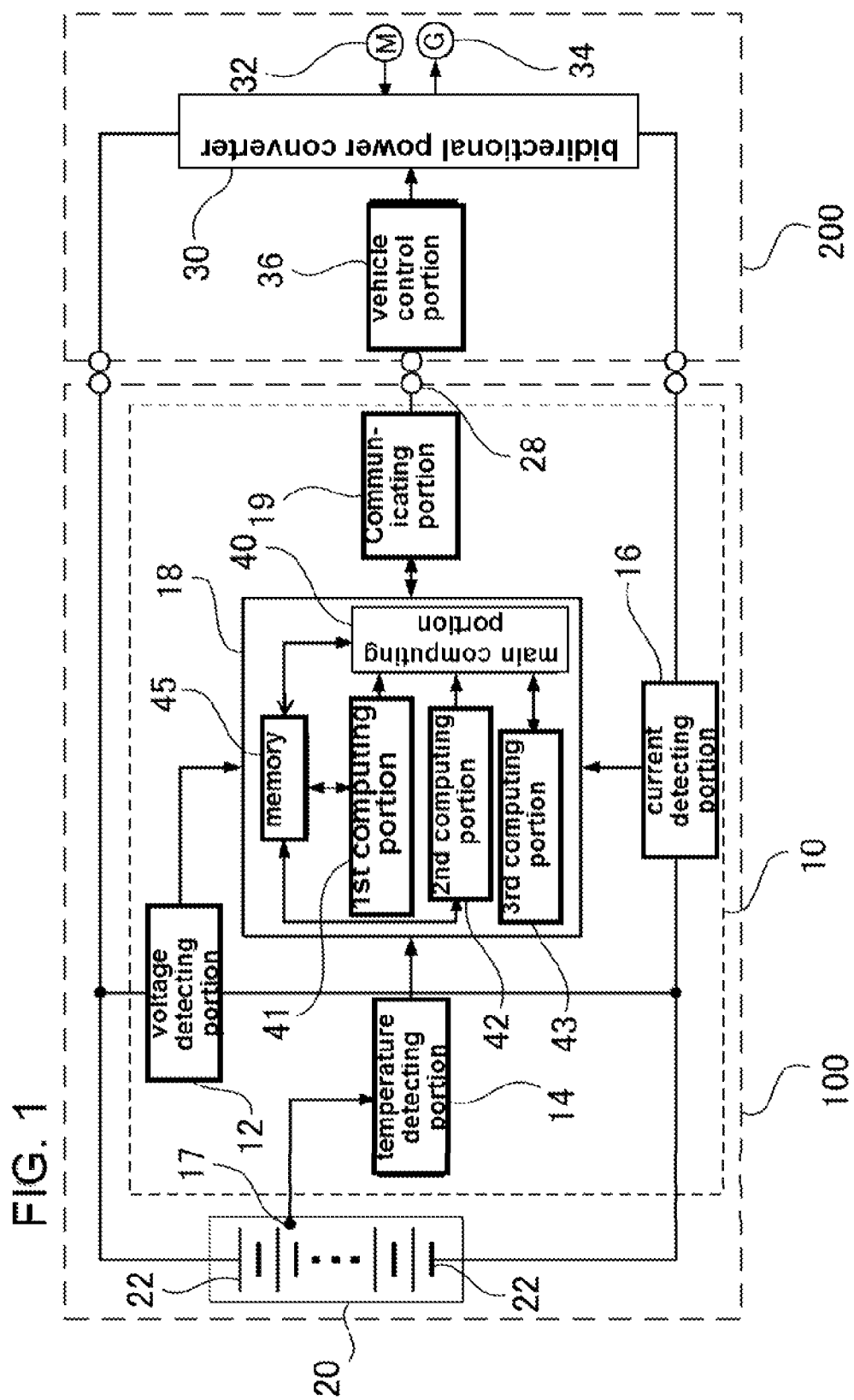
FIG. 1 is a block diagram showing a structure of a power supply unit according to an embodiment of the present disclosure.

FIG. 1 is a block diagram showing a structure of a power supply unit 100 according to an embodiment of the present invention. The power supply unit 100 shown in FIG. 1 comprises a battery unit 20 having at least one battery 22 which is charged or discharges, and a remaining capacity detecting unit 10. The remaining capacity detecting unit 10 comprises a voltage detecting portion 12, a temperature detecting portion 14, a current detecting portion 16, a remaining capacity computing portion 18, and a communicating portion 19. The voltage detecting portion 12 detects a voltage of the battery 22. The temperature detecting portion 14 detects a temperature of the battery 22. The current detecting portion 16 detects a charging current and a discharging current of the battery 22. The remaining capacity computing portion 18 computes signals inputted from the voltage detecting portion 12, the temperature detecting portion 14, and the current detecting portion 16, and detects a remaining capacity of the battery 22. The communicating portion 19 transmits the computed remaining capacity to a connecting equipment. This communicating portion 19 is connected to a connecting equipment communication terminal 28. The communicating portion 19 is connected to the connecting equipment through the connecting equipment communication terminal 28, and transmits a signal which represents the remaining capacity to the connecting equipment. In this embodiment, a vehicle 200 of an automobile car or the like as the connecting equipment is provided, and the power supply unit 100 is installed in the vehicle 200. The communicating portion 19 is connected and communicated to a vehicle control portion 36 in the vehicle 200.

In the vehicle 200 connected to the power supply unit 100, a bidirectional power converter 30 supplies an electric power from the power supply to a motor 32, and an electric power from a generator 34 to the battery unit 20. The bidirectional power converter 30 converts a direct current power of the battery unit 20 to a three-phase alternating current power, and supplies the three-phase alternating current power to the motor 32. Then the bidirectional power converter 30 converts an alternating current power from the generator 34 to a direct current power, and supplies the direct current power to the battery unit 20. The bidirectional power converter 30 is controlled by a vehicle control portion 36, the supply power from the battery unit 20 to the motor 32, and the charging power from the generator 34 to the battery unit 20 are controlled by the bidirectional power converter 30. The power supply unit 100 is explained in the following.

The secondary battery 22 incorporated in the battery unit 20 is a lithium ion battery or a nickel-hydrogen battery in this embodiment. But the rechargeable battery of a lithium polymer battery, a nickel-cadmium battery, or the like can be used as the battery. One battery or a plurality of the batteries are connected in series, in parallel, or in both series and parallel. The battery constitutes a battery module in which the plurality of the batteries are connected, and a plurality of the battery modules are connected, and it constitutes the battery unit 20.

The voltage detecting portion 12 detects a voltage of the battery 22 provided in the battery unit 20. The battery unit 20 shown in the drawing has a plurality of the batteries 22 connected in series. Consequently, the voltage detecting portion 12 detects a total voltage of the batteries connected in series. It is also possible to detect the voltage for each battery module constituting the battery unit 20. The voltage detecting portion 12 detects the voltage of the battery 22 in a predetermined sampling period, and outputs the detected voltage to the remaining capacity computing portion 18.

The voltage detecting portion 12 outputs the detected voltage as the digital signal to the remaining capacity computing portion 18 by converting an analog signal into a digital signal by means of an A/D converter. The voltage detecting portion 12 detects the voltage of the battery 22 in a constant predetermined sampling period, and outputs the detected voltage to the remaining capacity computing portion 18 as the digital signal. The sampling period is predetermined, preferably, for example, as 1 msec-10 msec. However the sampling period is also predetermined as 100 microsecond-100 msec. By shortening the sampling period, the variable voltage can be accurately detected. But in a short sampling period, it is necessary to use the expensive A/D converter having high speed processing. Therefore, the sampling period is optimally fixed based on parts costs and a required accuracy.

The temperature detecting portion 14 comprises a temperature sensor 17 which detects a temperature of the battery installed in the battery unit 20. The temperature sensor 17 comes in contact with the surface of the battery, comes in contact with the battery through a thermal conductor or approaches the surface of the battery and is thermally coupled to the battery to detect the temperature of the battery. The temperature sensor 17 is a thermistor. All units capable of converting a temperature into an electrical resistance, for example, a PTC, a varistor and the like, can be used for the thermistor 17. Moreover, a unit capable of detecting an infrared ray radiated from the battery and detecting a temperature in a non-contact state with the battery can also be used for the temperature sensor 17. The temperature detecting portion 14 also outputs the detected battery temperature in an analog signal to the remaining capacity computing portion 18 or converts the analog signal into a digital signal by the A/D converter to output the digital signal to the remaining capacity computing portion 18. The temperature detecting portion 14 detects the temperature of the battery in a constant sampling period or continuously, and outputs the temperature of the battery thus detected to the remaining capacity computing portion 18.

The current detecting portion 16 connects a resistive unit in series to the battery and detects a voltage induced to both ends of the resistive unit, and thus detects a discharge current flowing to the battery. The resistive unit is a resistor having a low resistance. A semiconductor such as a transistor or an FET can also be used for the resistive unit. The charge and discharge currents of the battery flow in opposite directions to each other. For this reason, positive and negative polarities induced to the resistive unit are inverted. Accordingly, the current can be decided to be the discharge current depending on the polarity of the resistive unit and the current can be thus detected with the voltage induced to the resistive unit. The reason is that the current is proportional to the voltage induced to the resistive unit. The current detecting portion 16 can accurately detect the discharge current of the battery. The current detecting portion 16 can also have such a structure as to detect a magnetic flux leaking out with a current flowing to a lead wire and to detect the current.

The current detecting portion 16 detects a current of the charging and discharging battery 22 in a predetermined sampling period, and outputs the detected voltage to the remaining capacity computing portion 18. The current detecting portion 16 also converts the analog signal into a digital signal by the A/D converter to output the digital signal to the remaining capacity computing portion 18. In a similar manner as to that of the voltage detecting portion 12. The sampling period is predetermined, preferably, for example, as 1 msec-10 msec. However the sampling period is also predetermined as 100 microsecond-100 msec. By shortening the sampling period, the variable voltage can be accurately detected.

A device for outputting a signal having a digital value in a constant sampling period from the voltage detecting portion 12, the temperature detecting portion 14 and the current detecting portion 16 to the remaining capacity computing portion 18 shifts a timing for outputting the digital signal from each of the detecting portions to the remaining calculating portion 18 and outputs the digital signal to the remaining capacity computing portion 18 in order, namely in each of the divided prescribed periods.

Figure 2:
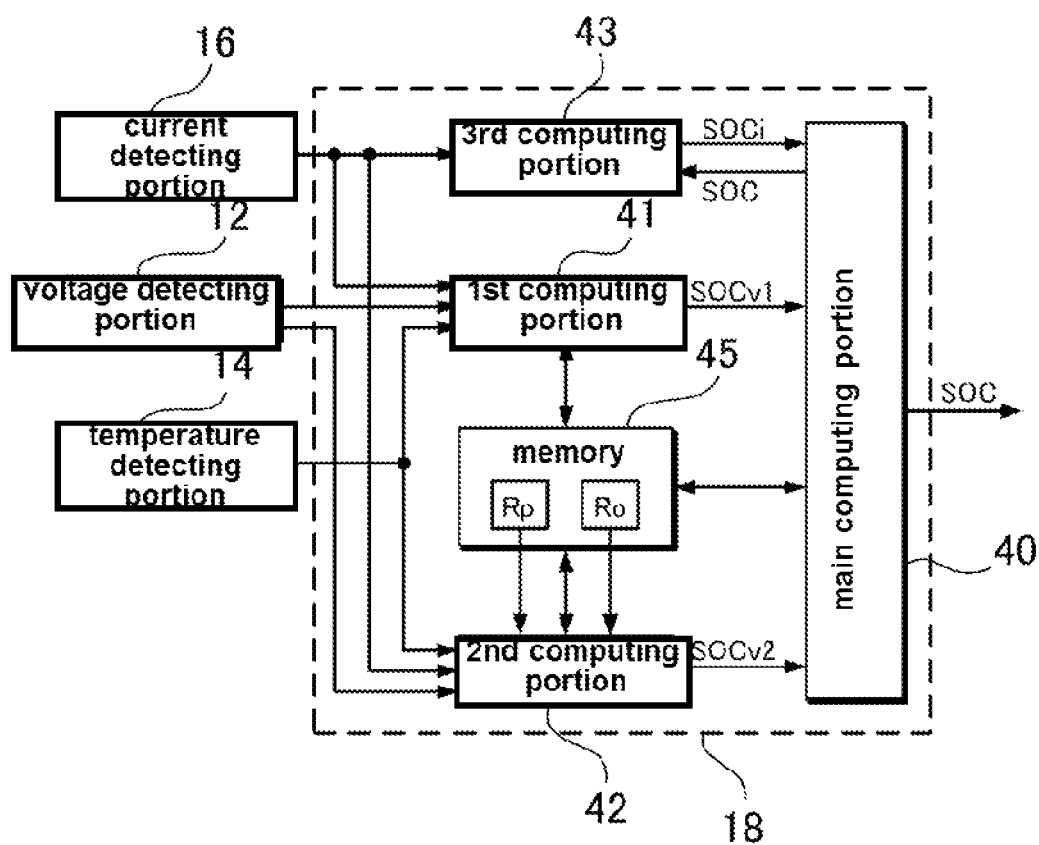
FIG. 2 is a block diagram showing a state in which the power supply unit shown in FIG. 1 detects a remaining capacity.

As shown the block diagram of FIG. 2, the remaining capacity computing portion 18 calculates and detects a remaining capacity of the battery 22, by calculating the signals inputted from the voltage detecting portion 12, the temperature detecting portion 14, and the current detecting portion 16. The remaining capacity computing portion 18 comprises a first computing portion 41, a second computing portion 42, a third computing portion 43, a main computing portion 40. The first computing portion 41 computes a first open circuit terminal voltage Voc1 based on a plurality of values of the current and the voltage inputted from the current detecting portion 16 and the voltage detecting portion 12, and computes a first remaining capacity [SOCv1 (%)] based on the first open circuit terminal voltage Voc1. The second computing portion 42 computes a second open circuit terminal voltage Voc2 based on values of the current and the voltage inputted from the current detecting portion 16 and the voltage detecting portion 12, a voltage drop Vo by an ohmic resistance Ro and a voltage drop Vp by a polarization resistance Rp, and computes a second remaining capacity [SOCv2(%)] based on the second open circuit terminal voltage Voc2. The third computing portion 43 calculates a third remaining capacity [SOCi (%)] based on an integrated value by integrating the current value inputted from the current detecting portion 16. The main computing portion 40 computes a real remaining capacity [SOC (%)] of the charging and discharging battery based on the first remaining capacity [SOCv1(%)] computed by the first computing portion 41, the second remaining capacity [SOCv2 (%)] computed by the second computing portion 42, and the third remaining capacity [SOCi (%)] calculated by the third computing portion 43.

(First Computing Portion 41)

The first computing portion 41 computes the first open circuit terminal voltage Voc1 based on the values of the current and the voltage inputted from the current detecting portion 16 and the voltage detecting portion 12. The first computing portion 41 averages the detected data of the current and the voltage detected plural times and inputted from the current detecting portion 16 and the voltage detecting portion 12, and computes the average of the current and the voltage. The first computing portion 41 computes the average of the current and the voltage, preferably, for example, during 2 sec. The duration of the average of the current and the voltage is not necessarily as 2 sec, so for example, it is possible to select a duration of 0.5 sec-5 sec. The duration of the average is adjusted by the number of digital signals inputted in a constant period. For example, when the digital signals showing the current or the voltage are inputted in a sampling period of 10 msec, the average is computed by averaging 200 digital signals in the duration of 2 sec.

The first computing portion 41 computes the first open circuit terminal voltage Voc1 by averaging the current and the voltage of the battery in the duration 1 (time interval 1). The second computing portion 42 computes the second open circuit terminal voltage Voc2 based on detecting values in the duration 2 (time interval 2) of the current and the voltage inputted from the current detecting portion 16 and the voltage detecting portion 12. Then in order to accurately compute and detect the first open circuit terminal voltage Voc1, the above duration 1 (time interval 1) is longer than the above duration 2 (time interval 2), because the longer duration (time interval) makes the average of the current and the voltage more accurate in a state of a comparatively high current.

The first computing portion 41 detects the voltage at the same timing as detecting the current. Namely, the current and the voltage are detected at the same timing. However, the timing of detecting the current and the voltage is not necessarily perfectly matching, so the timing can be almost the same, for example, detecting the current and the voltage within 1—several sampling periods can be acceptable.

Figure 3:
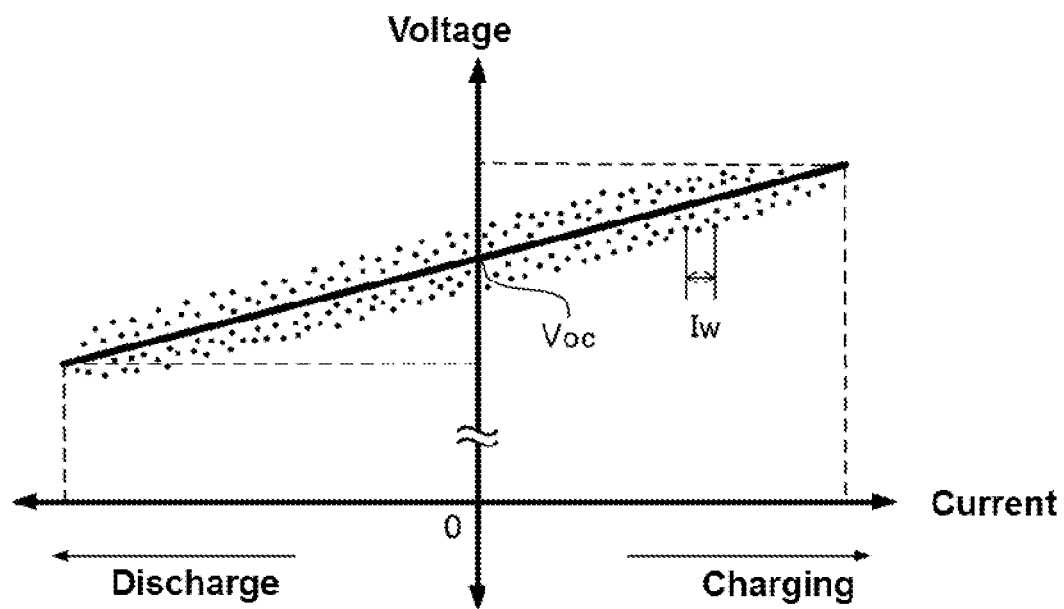
FIG. 3 is a graph showing a relationship between a current and a voltage based on a plurality of detected data of a current and a voltage of a battery as one explanatory embodiment.

The detected current and voltage data as the average are distributed as shown in FIG. 3. In this figure, the voltages are plotted in the timing of detecting the current. The current and the voltage are detected at least two times in the shifted time, and the linear function which represents the current-voltage characteristics is computed, then the first open circuit terminal voltage Voc1 at the current of 0 ampere is computed. The linear function of the current-voltage characteristics shown in FIG. 3 can be more accurately detected by increasing the number of measuring the current and voltage, computing it based on more plotted points. The first order function of the current-voltage characteristics can be more accurately detected according to a statistical regression such as the method of least squares by using a lot of measuring points of the current and voltage.

The first computing portion 41 detects the first remaining capacity [SOCv1(%)] based on the computed first open circuit terminal voltage Voc1. The remaining capacity computing portion 18 comprises a memory 45 to store data of the voltage-remaining capacity characteristics measured in advance which specify the remaining capacity from the open circuit terminal voltage Voc. The memory 45 stores the voltage-remaining capacity characteristics as a look-up table or a function. The voltage-remaining capacity characteristics are specified by measuring the battery voltage and the remaining capacity in the same type battery as the battery 22 in which the remaining capacity is detected. The voltage-remaining capacity characteristics are specified in the following measurement. After a standard battery is discharged until the minimum voltage of the battery, namely the remaining capacity 0% in the perfectly discharged state, the charging capacity are detected during charging until the maximum voltage of the remaining capacity 100% in the full charge. The voltage-remaining capacity characteristics are specified in the following measurement. After a standard battery is discharged until the minimum voltage of the battery, namely the remaining capacity 0% in the perfectly discharged state, the charging capacity are detected during charging until the maximum voltage of the remaining capacity 100% in the full charge. The remaining capacity of the standard battery is accurately detected as 0% when the standard battery is at the minimum voltage in the perfectly discharged state, and is accurately detected as 100% when the standard battery is at the minimum voltage in the full charge, and the remaining capacity of the battery is accurately detected from computing by integrating a charging current of the standard battery in the perfectly discharged state, therefore The voltage-remaining capacity characteristics can be accurately detected by detecting the voltage at that time while the remaining capacity is being detected.

(Second Computing Portion 42)

The second computing portion 42 computes the second open circuit terminal voltage Voc2 from the ohmic resistance Ro and the polarization resistance Rp as the parameters which vary depending on a degradation degree in addition to the current and voltage of the battery, and detects the second remaining capacity [SOCv2(%)] based on the second open circuit terminal voltage Voc2 and the voltage-remaining capacity characteristics. The second computing portion 42 computes the second open circuit terminal voltage Voc2 by computing both the voltage drop Vo by the ohmic resistance Ro and the voltage drop Vp by the polarization resistance Rp in the following equation 2, based on the values of the current and the voltage of the charging and discharging battery.

the second open circuit terminal voltage $Voc2 = V\_n - Vp - Vo - Vh$ $Vp = Rp \text{ [ohm]} \times I\_n \text{ [A]} \times tau \times a$ $Vo = Ro \text{ [ohm]} \times I\_n \text{ [A]} \times b \times c$ [Equation 2]

In the above equation 2,

V_n is the voltage of the battery at a certain time,

I_n is the current of the battery at the same time as the voltage is detected, a minus value (−) means a discharging current, a plus value (+) means a charging current, tau, a, b, c are constants specified by a temperature, Vh is a variable specified by hysteresis characteristics of charging and discharging of the battery.

Thus the second computing portion 42 detects the second remaining capacity [SOCv2(%)] by computing the second open circuit terminal voltage Voc2 considering the ohmic resistance Ro and the polarization resistance Rp as the parameters which vary depending on a degradation degree or the like, the remaining capacity can be highly accurately detected in the following situation. It is difficult that only the first remaining capacity [SOCv1(%)] specified by the first open circuit terminal voltage Voc1 which is computed from the measured value of the current and voltage appropriately shows the remaining capacity, for example, in the case of continuous discharge or charge, or small current. Even in such a case, by using the second remaining capacity [SOCv2(%)] which is specified by the second open circuit terminal voltage Voc2 computed in the equation 2 having the constants, the remaining capacity can be highly accurately detected. When the current and the voltage as the measured value are detected two times in the shifted time, in the case that the difference between the measured currents is big, the open circuit terminal voltage can be relatively accurately computed. But when the current and the voltage as the measured value are detected plural times in the shifted time, in the case that the variation width of the measured currents is small, in such a case, it is difficult to accurately detect an internal resistance R, then the open circuit terminal voltage cannot be accurately detected through such internal resistance. In the case that the variation width of the measured currents is small, the current variation width (lw) in the current-voltage characteristics of FIG. 3 is small, it is difficult to accurately detect the slope of the linear function of the current-voltage, and compute the internal resistance R. Therefore, in the conventional art, the real remaining capacity [SOC (%)] is computed based on both the current integrated remaining capacity [SOCi (%)] and the remaining capacity [SOCv (%)]. And in this method, in the case of the big current variation width, it is possible to accurately detect the remaining capacity [SOCv (%)]. But in the case of the small current variation width, it is difficult to accurately detect the remaining capacity [SOCv (%)]. In contrast, this embodiment, the second computing portion 42 detects the second remaining capacity [SOCv2(%)] by computing the second open circuit terminal voltage Voc2 considering the ohmic resistance Ro and the polarization resistance Rp as the parameters which vary depending on a degradation degree or the like. And the real remaining capacity [SOC (%)] is computed considering the second remaining capacity [SOCv2(%)]. Therefore, in the case of continuous discharge or charge, or small current, the remaining capacity can be highly accurately detected.

The above duration 2 (time interval 2) detecting the current and the voltage for computing the second open circuit terminal voltage Voc2 is shorter than the above duration 1 (time interval 1) detecting the current and the voltage for computing the first open circuit terminal voltage Voc1 by averaging the current and the voltage. For example, the momentary current and the momentary voltage for computing the second open circuit terminal voltage Voc2 are detected by a one time digital signal inputted from the current detecting portion and the voltage detecting portion, or by the average of the detected data of 2 to 10 times. In order to accurately detect the varying current and the varying voltage, the above duration 2 (time interval 2) detecting the momentary current and the momentary voltage is short.

The second computing portion 42 uses the ohmic resistance Ro and the polarization resistance Rp in order to detect the second open circuit terminal voltage Voc2. The values of these which are specified from the degradation degree are stored in the memory 45. Namely the ohmic resistance Ro and the polarization resistance Rp corresponding to the degradation degree in the battery are measured by using the standard battery in advance. The measured values of the ohmic resistance Ro and the polarization resistance Rp are stored in the memory 45 as a look-up table or a function. As the degradation degree of the battery is specified by the internal resistance R, the memory 45 also stores data which specifies the degradation degree corresponding to the internal resistance R as a look-up table or a function. Thus The second computing portion 42 detects the degradation degree of the battery, and specifies the ohmic resistance Ro and the polarization resistance Rp from the degradation degree and the data stored in the memory 45.

Furthermore, the above equation 2 uses tau, a, b, c as the constants which are specified from a temperature. These constants are detected in specific temperatures of the standard battery, and tau, a, b, c corresponding to temperatures are stored as the constants in the memory 45.

In addition, the above equation 2 uses Vh as a variable which compensates the hysteresis characteristics. Vh compensating the hysteresis characteristics of the battery is also detected from charging and discharging of the standard battery. And the detected data are stored in the memory 45 as a look-up table or a function.

The second computing portion 42 computes the second open circuit terminal voltage Voc2 from the above equation 2 by specifying the voltage detected in the voltage detecting portion 12, the current detected in the current detecting portion 16, the degradation degree of the battery from the internal resistance R and the ohmic resistance Ro and polarization resistance Rp specified from the stored data of the memory 45, the detected temperature of temperature detecting portion 14 and the constants of tau, a, b, c specified from the stored data of the memory 45, and Vh compensating the hysteresis characteristics of the battery specified from the stored data of the memory 45.

Moreover, the second computing portion 42 detects the second remaining capacity SOCv2 from the second open circuit terminal voltage Voc2. The remaining capacity computing portion 18 stores a voltage-remaining capacity characteristics in the memory 45 which is measured in advance and specifies the second remaining capacity SOCv2 from the second open circuit terminal voltage Voc2. In the voltage-remaining capacity characteristics which specifies the second remaining capacity SOCv2 from the second open circuit terminal voltage Voc2 can also use, it can use the voltage-remaining capacity characteristics stored in the memory 45 which specifies the first remaining capacity SOCv1 from the first open circuit terminal voltage Voc1. Besides, the second remaining capacity SOCv2 can be also detected from exclusive useable stored data for in the memory 45 by which the second remaining capacity SOCv2 is specified from the second open circuit terminal voltage Voc2.

The voltage-remaining capacity characteristics by which the second remaining capacity SOCv2 is specified from the second open circuit terminal voltage Voc2 are also measured in the standard battery. The result of measurements is stored in the memory 45 as a look-up table or a function.

(Third Computing Portion 43)

The third computing portion 43 computes the third remaining capacity [SOCi (%)] based on an integrated value by integrating the current value inputted from the current detecting portion 16 which detects the charging and discharging currents. The remaining capacity (Ah) is left and computed by integrating the discharging current subtracted from integrating the charging current, and the third remaining capacity [SOCi (%)] is computed by using the remaining capacity (Ah) and the full charge capacity (Ah). The charging capacity is computed by integrating the charging current. And the discharging capacity is computed by integrating the discharging current.

The third computing portion 43 accurately computes the remaining capacity (Ah) by subtracting the integrated value of discharging current from the full charge state of the battery, or by adding the integrated value of charging current to the fully discharged state. However, the battery is not necessarily in the full charge state or the fully discharged state. Therefore, the third computing portion 43 calculates the latest remaining capacity (Ah) from the real remaining capacity SOC (%) computed by the below main computing portion 40 and the full charge capacity (Ah), and calculates the varying remaining capacity (Ah) by adding the integrated value of charging current to the latest remaining capacity (Ah) or by subtracting the integrated value of discharging current from the latest remaining capacity (Ah), and computes the third remaining capacity SOCi (%) from the ratio of the computed remaining capacity (Ah) to the full charge capacity (Ah). Thus the third remaining capacity SOCi (%) computed from the integrated value of the charging and discharging current is accurately computed.

(Main Computing Portion 40)

The main computing portion 40 can compute the varying real remaining capacity [SOC (%)] of the charging and discharging battery by weighted-averaging the first remaining capacity [SOCv1(%)] computed in the first computing portion 41, the second remaining capacity [SOCv2(%)] computed in the second computing portion 42, and the third remaining capacity SOCi (%) computed in the third computing portion 43 in the following equation 1.

The real remaining capacity [SOC (%)]=$A \times$SOCi (%)+$B \times$SOCv1(%)+$C \times$SOCv2(%)  [Equation 1]

In the above equation 1, A, B, and C are constants, A is equal to or more than 0, and B is equal to or more than 0, and C is more than 0, and A+B+C=1. "×" means multiplication in this disclosure.

In order to more accurately compute the real remaining capacity SOC (%) from the first remaining capacity SOCv1, the second remaining capacity SOCv2, and the third remaining capacity SOCi, the main computing portion 40 can specify the constants of A, B, and C.

Figure 4:
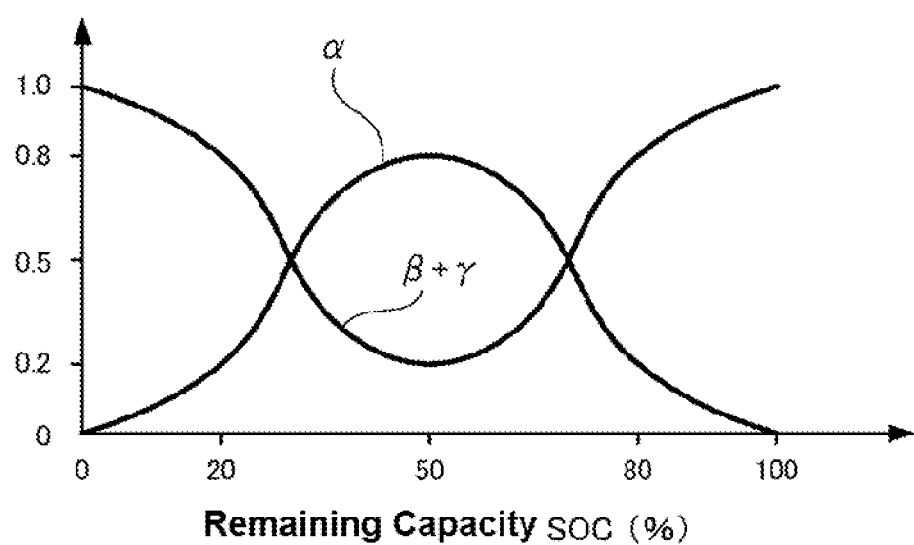
FIG. 4 is a graph representing a relationship between A, B, and C for a remaining capacity of the battery.
Figure 5:
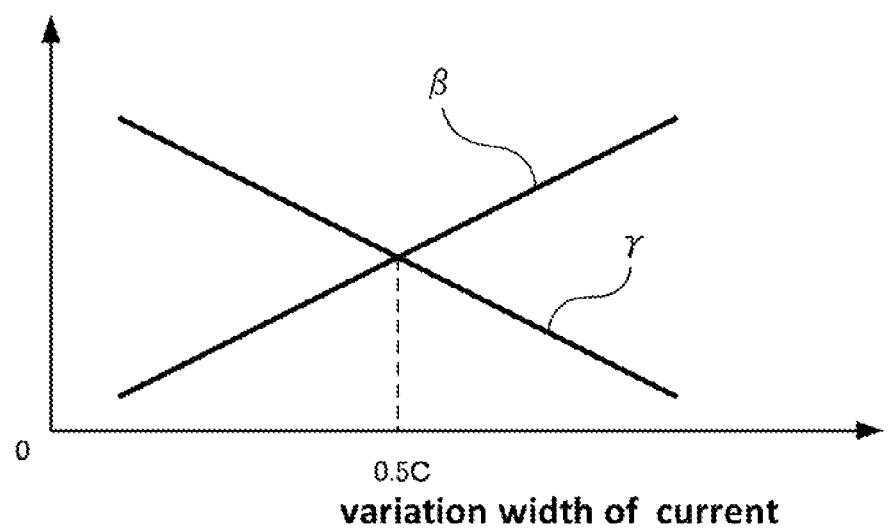
FIG. 5 is a graph representing a relationship between B and C for a current of the battery.

The constants of A, B, and C are optimally determined based on the remaining capacity SOC and the current of the battery as shown in FIGS. 4 and 5. The first remaining capacity SOCv1 and second remaining capacity SOCv2 detected from the open circuit terminal voltage Voc are highly accurate around the maximum voltage or the minimum voltage of the open circuit terminal voltage Voc. The remaining capacity In the range of the minimum voltage or the maximum voltage of the open circuit terminal voltage Voc is the minimum or the maximum. B weights the first remaining capacity SOCv1 and C weights the second remaining capacity SOCv2. Therefore, as shown in FIG. 4, the sum of B+C is high In the range of the minimum or the maximum of the remaining capacity SOC. A weights the third remaining capacity SOCi. A is low in this range. And the first remaining capacity SOCv1 which is specified from only the current and voltage is more accurate in the range of high current of the battery than the second remaining capacity SOCv2. As shown in FIG. 5, B which weights the first remaining capacity SOCv1 increases as the variation width of the current increases. C which weights the second remaining capacity SOCv2 increases as the variation width of the current decreases.

As described above, after detecting the first remaining capacity SOCv1, the second remaining capacity SOCv2, and the third remaining capacity SOCi, the main computing portion 40 computes the real remaining capacity of the charging and discharging battery by weighted-averaging these. As A, B, and C which are used in weighted-averaging are optimally determined from the remaining capacity SOC, the current, and voltage of the battery, the main computing portion 40 can computes the real remaining capacity. For example, when the remaining capacity is around or in the vicinity of 50%, B+C is set at a low value of 0-0.4, and A is set at a high value of 0.6-1, and the real remaining capacity is detected. When the remaining capacity of the battery is 0%-20% or 80%-100%, A is set at a low value of 0-0.2, and B+C is set at a high value of 0.8-1. Then when the remaining capacity of the battery is at or in the vicinity of 0% or 100%, the remaining capacity is computed from the first remaining capacity SOCv1 and the second remaining capacity SOCv2 as A=0, because the remaining capacity at or in the vicinity of 0% or 100% is accurately detected from the open circuit terminal voltage Voc.

And in B which weights the first remaining capacity SOCv1 and C which weights the second remaining capacity SOCv2, when the current variation width is equal to or more than 0.5 C, B is higher than C. When the current variation width is equal to or less than 0.5 C, B is lower than C. Then when the current variation width is at or in the vicinity of 0, the remaining capacity is computed from the second remaining capacity SOCv2 and the third remaining capacity SOCi as B=0.

As described above, after detecting the first remaining capacity SOCv1, the second remaining capacity SOCv2, and the third remaining capacity SOCi, the main computing portion 40 computes the real remaining capacity of the charging and discharging battery by weighted-averaging these. As A, B, and C which are used in weighted-averaging are optimally determined from the remaining capacity SOC, the current, and voltage of the battery, the main computing portion 40 can computes the real remaining capacity. For example, when the remaining capacity is around or in the vicinity of 50%, B+C is set at a low value of, for example, 0-0.4, and A is set at a high value of 0.6-1, and the real remaining capacity is detected. When the remaining capacity of the battery is 0%-20% or 80%-100% and the current variation width is equal to or more than 0.5 C, A is set at a low value of 0-0.2, and B is higher than C, and B+C is set at a high value of 0.8-1. And When the remaining capacity of the battery is 0%-20% or 80%-100% and the current variation width is equal to or less than 0.5 C, and B is lower than C, and B+C is set at a high value of 0.8-1. In addition, the main computing portion 40 can also compute as B=0.

The real remaining capacity computed by the main computing portion 40 is transmitted from the connecting equipment communication terminal 28 to the vehicle control portion 36 via the communicating portion 19. Further the real remaining capacity computed by the main computing portion 40 is also inputted in the third computing portion 43.

The third computing portion 43 calculates the latest remaining capacity (Ah) from the real remaining capacity SOC (%) inputted from the main computing portion 40 and the full charge capacity (Ah). And the third computing portion 43 adds the charging capacity (Ah) by integrating the charging current detected by the current detecting portion 16 to this latest remaining capacity (Ah), and subtracts the discharging capacity (Ah) by integrating the discharging current detected by the current detecting portion 16 from this latest remaining capacity (Ah), then in this manner calculates the remaining capacity (Ah). Moreover the third remaining capacity SOCi (%) is computed from such remaining capacity (Ah) and the full charge capacity (Ah).

As mentioned above, the remaining capacity of the battery is accurately detected, at the times during charging and discharging an available amount of power is accurately estimated. So the vehicle can appropriately control the amount of power, and use the battery safely and effectively.

The aforementioned power supply unit can be used as a power supply for vehicles. The power supply unit can be installed on electric vehicles such as hybrid cars that are driven by both an internal-combustion engine and an electric motor, and electric vehicles that are driven only by an electric motor. The power supply unit can be used as a power supply device for these types of vehicles.

(Hybrid Car Power Supply Unit)

Figure 6:
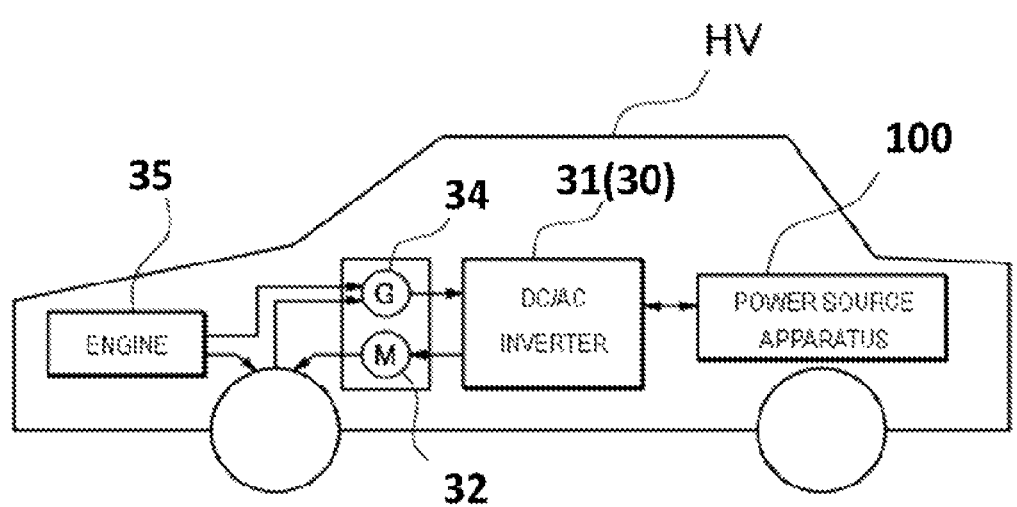
FIG. 6 is a block diagram showing one explanatory embodiment of a hybrid car driven by an engine and a motor in which the power supply unit is installed.

FIG. 6 is a block diagram showing an exemplary hybrid car that is driven both by an engine and an electric motor, and includes the power supply unit. The illustrated vehicle HV with the power supply unit includes an electric motor 32 and an internal-combustion engine 35 that drive the vehicle HV, a power supply unit 100 that supplies electric power to the electric motor 32, and an electric generator 34 that charges batteries of the power supply unit 100. The power supply unit 100 is connected to the electric motor 32 and the electric generator 34 via a DC/AC inverter 31 of a bidirectional power converter 30. The vehicle HV is driven both by the electric motor 32 and the internal-combustion engine 35 with the batteries of the power supply unit 100 being charged/discharged. The electric motor 32 is energized with electric power and drives the vehicle in a poor engine efficiency range, e.g., in acceleration or in a low speed range. The electric motor 32 is energized by electric power that is supplied from the power supply unit 100. The electric generator 34 is driven by the engine 35 or by regenerative braking when users brake the vehicle so that the batteries of the power supply unit 100 are charged.

(Electric Vehicle Power Supply Unit)

Figure 7:
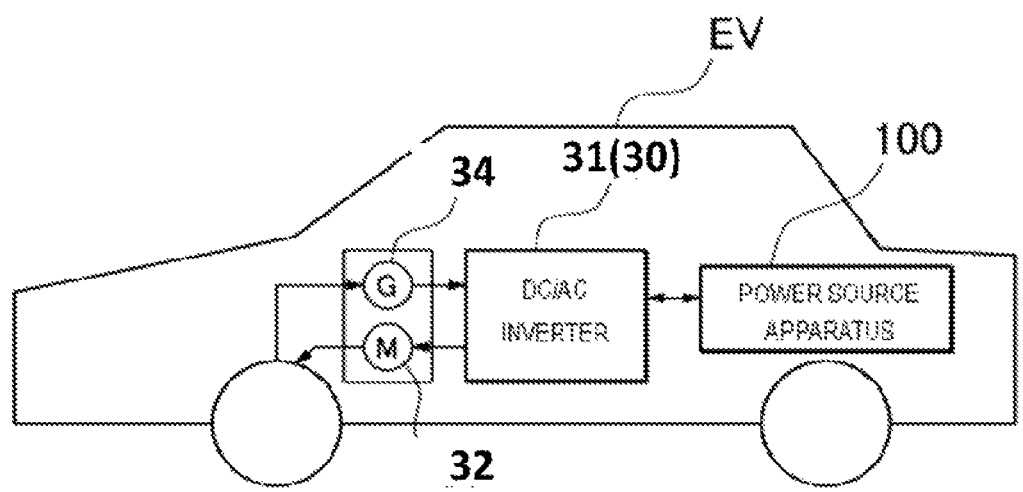
FIG. 7 is a block diagram showing one explanatory embodiment of an electric car driven only by a motor in which the power supply unit is installed.

FIG. 7 shows an exemplary electric vehicle that is driven only by an electric motor, and includes the power supply unit. The illustrated vehicle EV with the power supply unit includes the electric motor 32, which drives the vehicle EV, the power supply unit 100, which supplies electric power to the electric motor 32, and the electric generator 34, which charges batteries of the power supply unit 100. The power supply unit 100 is connected to the electric motor 32 and the electric generator 34 via a DC/AC inverter 31 of a bidirectional power converter 30. The electric motor 32 is energized by electric power that is supplied from the power supply device unit. The electric generator 94 can be driven by vehicle EV regenerative braking so that the batteries of the power supply unit 100 are charged.

In the above vehicle, both of the electric motor 32 and the electric generator 34 are installed. Moreover the vehicle can be equipped with either one of the motor and the generator 34. And the vehicle can be equipped with one device which operates as both the motor and the generator. In this type of the vehicle, for example, the motor which also operates as a generator is installed. This vehicle can drive by the motor using the power from the power supply unit, and the power supply unit is charged through regenerative braking of decelerating the vehicle.

Storage Battery Unit Equipped with this Power Supply Unit (Storage Battery Unit Equipped with Power Supply Unit)

Figure 8:
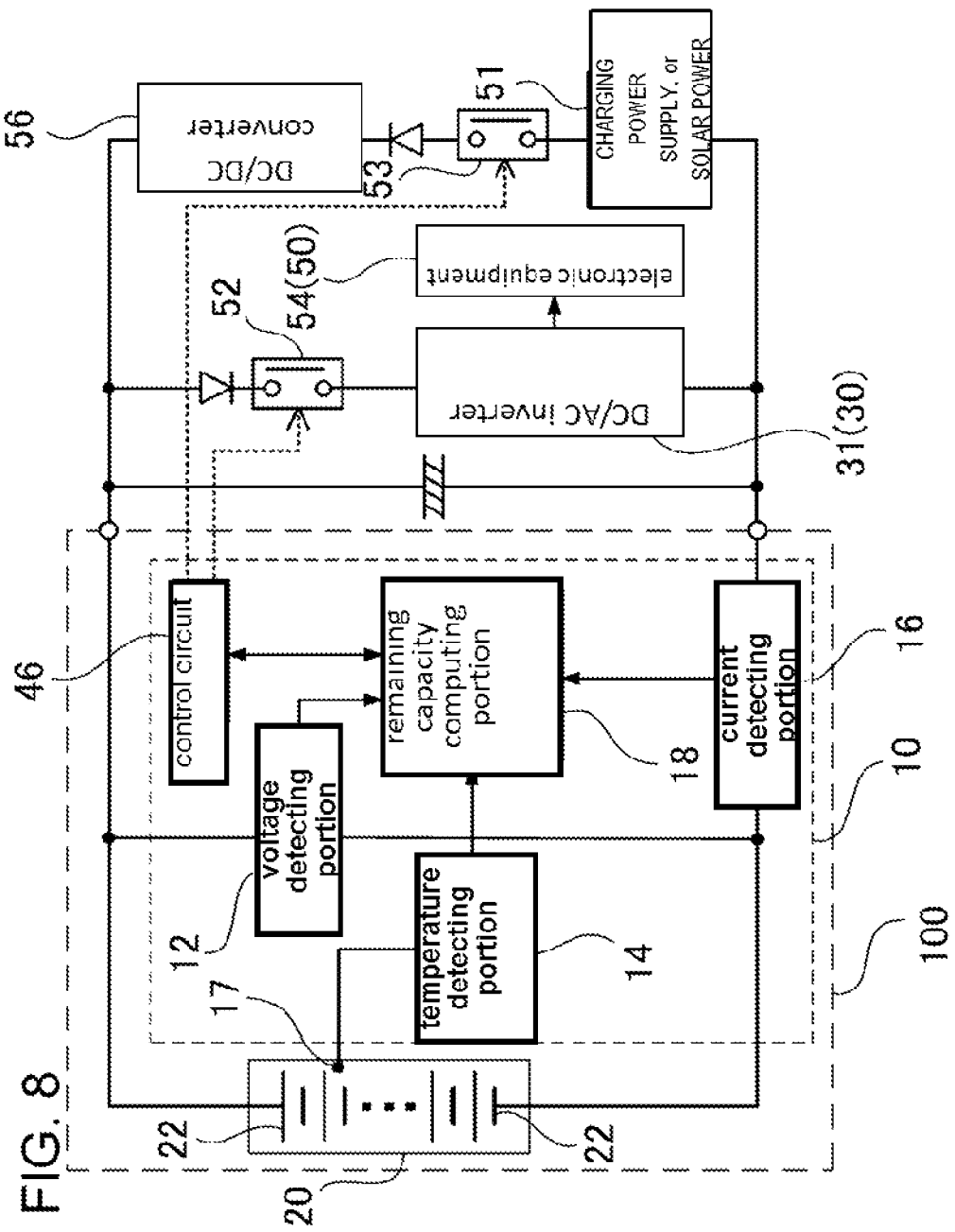
FIG. 8 is a block diagram showing one explanatory embodiment of a storage battery unit using the power supply unit.

The power supply unit can be used not only as power supply of mobile unit but also as stationary power storage. For example, examples of stationary storage battery unit can be provided by an electric power system for home use or plant use that is charged with sunlight or with midnight electric power and is discharged when necessary, a power supply for street lights that is charged with sunlight during the daytime and is discharged during the nighttime, or a backup power supply for signal lights that drives signal lights in the event of a power failure. FIG. 8 shows an exemplary circuit diagram. In this illustrated power supply unit 100, a power supplied by a charging power source 51 of midnight electric power, solar cells or the like is adjusted to the predetermined voltage by a DC/DC converter 56. And the battery 22 in the battery unit 20 is charged by such power. The power from the battery unit 20 is provided to a load 50 via a DC/AC inverter 31 of a bidirectional power converter 30. The power supply unit 100 has a charging mode and a discharging mode. The DC/AC inverter 31 and the charging power source 51 are connected to the power supply unit 100 through a discharging switch 52 and a charging switch 53, respectively. The discharging switch 52 and the charging switch 53 are turned ON/OFF by a control circuit 46 of the power supply unit 100. In the charging mode, the control circuit 46 turns the charging switch 53 ON, and turns the discharging switch 52 OFF so that the power supply unit 100 can be charged by the charging power source 51. When the charging operation is completed so that the battery units are fully charged or when the battery units are charged to a capacity not lower than a predetermined value and the load side requests electric power, the charging power source 51 turns the charging switch 53 OFF, and turns the discharging switch 52 ON. Thus, operation is switched from the charging mode to the discharging mode so that the power supply unit 100 can be discharged to supply power to the DC/AC inverter 31. In addition, if necessary, the charging switch 53 may be turned ON, while the discharging switch 52 may be turned ON so that the DC/AC inverter 31 can be supplied with electric power while the power supply unit 100 can be charged.

The DC/AC inverter 31 driven by the power supply unit 100 is connected to the power supply unit 100 through the discharging switch 52. In the discharging mode of the power supply unit 100, the control circuit 46 turns the discharging switch 52 ON so that the power supply unit 100 is connected to the DC/AC inverter 31. Thus, an electronic equipment 54 of a load 50 is driven with electric power from the power supply unit 100. The discharging switch 52 is turned ON/OFF by the control circuit 46 of the power supply unit 100. The control circuit 46 includes a communication interface (not shown in a figure) for communicating with an external device. The control circuit 46 can be connected to a host device (not shown in a figure) based on existing communications protocols such as UART and RS-232C. Also, the power supply unit may include a user interface that allows users to operate if necessary.

The above storage battery unit Is charged by the electric power from the externally connected charging power source as a power source, and the electric power is provided to the externally connected load. Moreover, a power source used in the storage battery unit can be provided to the load or a power source can be charged by the electric power from the externally connected charging power source,

INDUSTRIAL APPLICABILITY

A power supply unit according to the present invention can be suitably used as power supply units of plug-in hybrid vehicles and hybrid electric vehicles that can switch between the EV drive mode and the HEV drive mode, electric vehicles, and the like. A vehicle including this power supply unit according to the present invention can be suitably used as plug-in hybrid vehicles, hybrid electric vehicles, electric vehicles, and the like. Also, a power supply unit according to the present invention can be suitably used as backup power supply devices that can be installed on a rack of a computer server, backup power supply devices for wireless communication base stations, electric power storages for home use or plant use, electric power storage devices such as electric power storages for street lights connected to solar cells, backup power supplies for signal lights, and the like.

The invention claimed is:

1. A power supply unit comprising:
a charging and discharging battery;
a current detector configured to measure a current charging or discharging the battery;
a voltage detector configured to measure a voltage of the battery; and
a remaining capacity meter configured to indicate a remaining capacity of the battery based on the current detected by the current detector and the voltage detected by the voltage detector, wherein the voltage detector outputs the measured voltage of the battery to the remaining capacity meter, and the current detector outputs the measured current of the battery to the remaining capacity meter,
a remaining capacity controller, in communication with the remaining capacity meter, the remaining capacity controller comprising:
a first voltage meter to determine a first open circuit terminal voltage Voc1 based on a plurality of values of the current input from the current detector and a plurality of values of the voltage input from the voltage detector, a first remaining capacity value being based on the first open circuit terminal voltage Voc1;
a second voltage meter to determine a second open circuit terminal voltage Voc2 based on values of the current input from the current detector and values of the voltage input from the voltage detector, a voltage drop Vo by an ohmic resistance Ro, and a voltage drop Vp by a polarization resistance Rp, a second remaining capacity value being based on the second open circuit terminal voltage Voc2;
an integrator to determine a third remaining capacity value based on an integration of a detected current input from the current detector; and
a summer to determine the remaining capacity [SOC (%)] of the battery by weighted-averaging the first remaining capacity [SOCv1(%)], the third remaining capacity [SOCi (%)], and the second remaining capacity [SOCv2(%)] in the following equation

[SOC (%)]=$A$×SOC$i$ (%)+$B$×SOC$v$1(%)+$C$×SOC$v$2 (%)

where, A, B, and C are constants,
A is equal to or more than 0,
B is equal to or more than 0,
C is more than 0,
A+B+C=1, and
at least one of A and B is more than 0.

2. The power supply unit according to claim 1, wherein the remaining capacity computing portion comprises a memory to store values of A, B, and C, and the values of A stored in the memory are low in the range of high and low level in the real remaining capacity of the battery such that the third remaining capacity is lightly weighted-averaged.

3. The power supply unit according to claim 1, wherein the remaining capacity computing portion comprises a memory to store values of A, B, and C, and the values of B stored in the memory are high in the range of a large variation width in the current of the battery such that the first remaining capacity is heavily weighted-averaged.

4. A power supply unit comprising:
a charging and discharging battery;
a current detector configured to measure a current charging or discharging the battery;
a voltage detector configured to measure a voltage of the battery; and
a remaining capacity meter configured to indicate a remaining capacity of the battery based on the current detected by the current detector and the voltage detected by the voltage detector, wherein the voltage detector outputs the measured voltage of the battery to the remaining capacity meter, and the current detector outputs the measured current of the battery to the remaining capacity meter,
a remaining capacity controller, in communication with the remaining capacity meter, the remaining capacity controller comprising:
a first voltage meter to determine a first open circuit terminal voltage Voc1 based on a plurality of values of the current input from the current detector and a plurality of values of the voltage input from the voltage detector, a first remaining capacity value being based on the first open circuit terminal voltage Voc1;
a second voltage meter to determine a second open circuit terminal voltage Voc2 based on values of the current input from the current detector and values of the voltage input from the voltage detector, a voltage drop Vo by an ohmic resistance Ro, and a voltage drop Vp by a polarization resistance Rp, a second remaining capacity value being based on the second open circuit terminal voltage Voc2; and
an integrator to determine a third remaining capacity value based on an integration of a detected current input from the current detector;
wherein the second voltage meter determines the second open circuit terminal voltage Voc2 by determining both the voltage drop Vo by the ohmic resistance Ro and the voltage drop Vp by the polarization resistance Rp in the following equation, based on the values of the current and the voltage of the battery;

$Voc2 = V\_n - Vp - Vo - Vh$ $Vp = Rp \text{ [ohm]} \times I\_n \text{ [A]} \times tau \times a$ $Vo = Ro \text{ [ohm]} \times I\_n \text{ [A]} \times b \times c$ where,
V_n is the voltage of the battery at a certain time,
I_n is the current of the battery at the same certain time,
− means a discharging current,
+ means a charging current,
tau, a, b, c, are constants specified by a temperature, and
Vh is a variable specified by hysteresis characteristics of charging and discharging of the battery.

* * * * *